United States Patent [19]

Koechner

[11] Patent Number: 4,870,352
[45] Date of Patent: Sep. 26, 1989

[54] CONTACTLESS CURRENT PROBE BASED ON ELECTRON TUNNELING

[75] Inventor: Walter Koechner, Great Falls, Va.
[73] Assignee: Fibertek, Inc., Va.
[21] Appl. No.: 215,264
[22] Filed: Jul. 5, 1988
[51] Int. Cl.$^4$ ............................................. G01R 11/00
[52] U.S. Cl. ................................... 324/158 D; 250/310
[58] Field of Search ....................... 324/158 R, 158 D; 250/306, 307, 309, 310

[56] References Cited

U.S. PATENT DOCUMENTS

| | | | |
|---|---|---|---|
| 4,062,632 | 12/1977 | Dixon | 324/158 D |
| 4,694,170 | 9/1987 | Slodzian et al. | 250/310 |
| 4,705,954 | 11/1987 | Rummel et al. | 250/307 |
| 4,730,158 | 3/1988 | Kasai et al. | 324/158 R |
| 4,766,311 | 8/1988 | Seiler et al. | 250/307 |

Primary Examiner—Reinhard J. Eisenzopf
Assistant Examiner—Edward Urban
Attorney, Agent, or Firm—Herman J. Hohauser

[57] ABSTRACT

A method and apparatus for non-destructive monitoring of the performance parameters of a photodiode prior to integration into a focal plane array are characterized by the use of electron tunneling techniques. The photodiode under test is illuminated with infrared radiation to generate a current therein. The current within the photodiode is measured by a contactless tunnel current probe. The measured current is electrically processed to determine the dynamic resistance and responsivity of the photodiode in order to evaluate its performance. The apparatus can also be used for testing integrated circuits in the active mode at a plurality of locations.

15 Claims, 5 Drawing Sheets

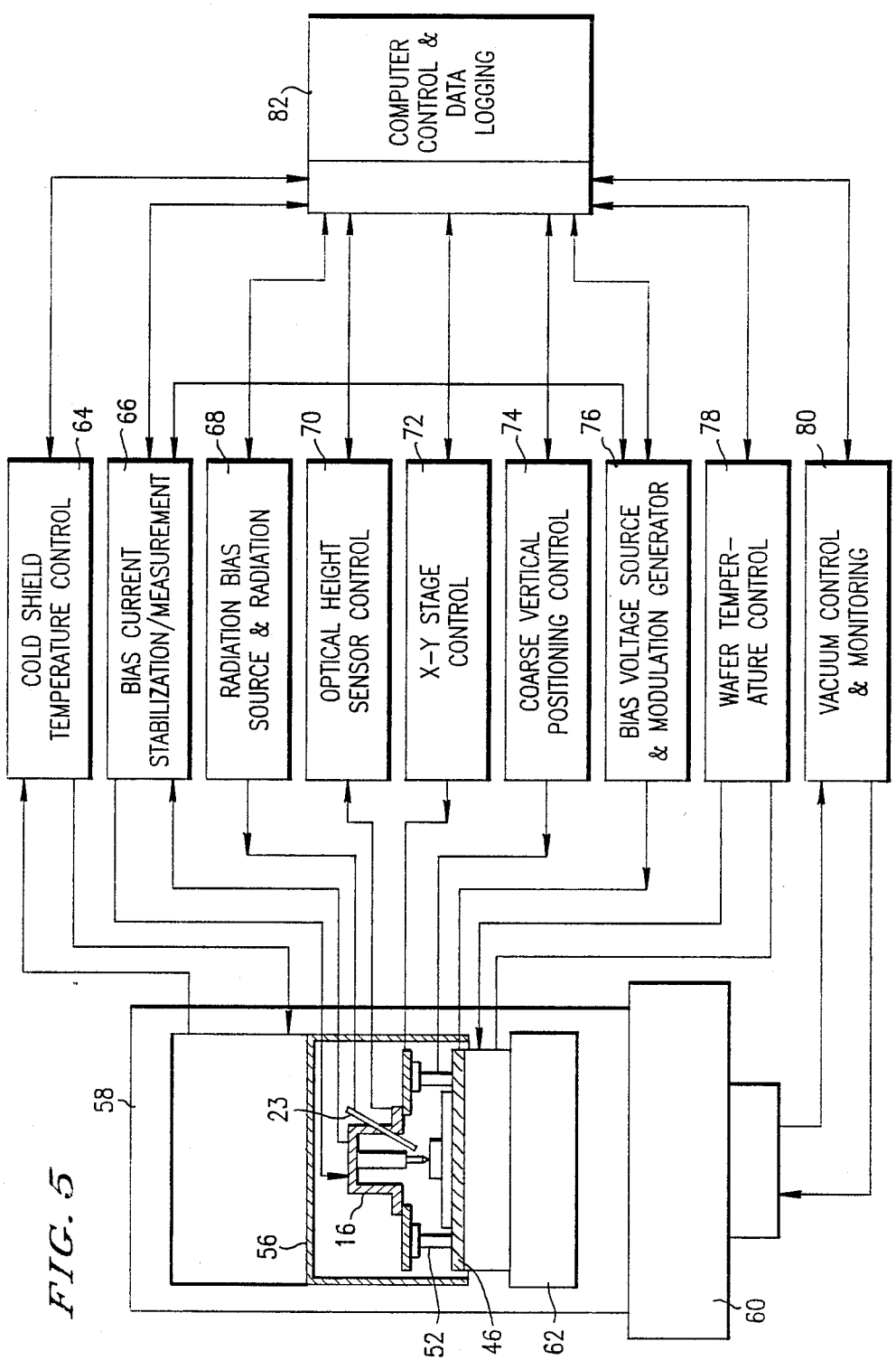

CONTACTLESS CURRENT PROBE BASED ON ELECTRON TUNNELING

BACKGROUND OF THE INVENTION

There is a large need in the infrared detector industry for in process monitoring of photodiodes prior to integration into a focal plane array (FPA). An in-situ diode performance measurement will increase the yield of focal plane arrays and result in dramatic cost savings. Photovoltaic mercury cadium telluride is the material of choice for focal plane arrays due to its high spectral sensitivity and production status. However, low yield and resulting high costs of large focal plane arrays currently limit its applications. In order to ensure that future detector needs are met, the yield must be increased. One of the key issues which must be addressed in order to increase yield is that more emphasis must be placed on FPA testing. Development of techniques for microscopic mapping of materials parameters will improve material and device evaluation. A non-destructive in process control method is required which determines the electrical and optical parameters of each diode at the wafer level.

BRIEF DESCRIPTION OF THE PRIOR ART

There is shown in FIG. 1, the basic configuration of a tunneling current probe (TCP). The probe 2 includes a metallic tip 4 mounted on a piezoelectric driver (not shown) used to adjust the distance between the tip and the surface of a contact pad 6. Electronic amplifiers are also required for a control loop of the probe. The probe 2 is preferably formed of tungsten or platinum and includes a single atom tip 4 spaced from the surface atoms 8 of the contact surface to define a gap G of between 5 and 10 Angstroms. The contact pad typically comprises gold or a gold/nickel alloy. Although the technology and basic understanding needed to implement a system like the one shown in FIG. 1 have existed for quite some time, it was not until the discovery of the atomic scale lateral resolution of this probe that interest in the probe itself really started. This discovery led immediately to the invention of the scanning tunneling microscope (STM) disclosed in the Binnig et al U.S. Pat. No. 4,343,993, and the technology developed around this application stimulated the exploration of its micropositioning capabilities in a number of novel applications such as subnanometer scale microfabrication, lithography and metrology. A number of less conventional applications have also been described such as the use of the probe for potentiometric measurements with subnanometer resolution.

In order to measure the response of a p-n junction and determine the performance of a diode, a current must flow within the diode. In the absence of physical contact, an electron beam is required to measure the current-voltage characteristics, spectral response, and resistance area product. To date, only one type of electron beam has been evaluated for this application; namely, the scanning electron microscope (SEM). This technique is based on the generation of an electron beam by an electron beam gun and an accelerating voltage of about 20 KV. The beam is finely focused onto the test circuit. Magnetic or electrostatic deflection can be used to move the beam to another electron beam releases secondary electrons at the test location. Secondary electrons have an energy distribution with a maximum of a few electron volts. Voltage changes within the device under test affect the trajectories of the secondary electrons or the energy distribution. These parameters can be measured either by voltage contrast measurement or by a retarding field spectrometer. A typical system of this kind is made by IMT of West Germany.

While the prior scanning electron microscopy photodiode testers normally operate satisfactorily, they tend to be rather large and expensive. Moreover, the delicate nature of the $Hg_{l-x}Cd_xTe$ detector makes it susceptible to damage by energetic electrons such as can occur with scanning electron microscopy.

The present invention was developed in order to overcome these and other drawbacks of the prior SEM testing techniques by using a tunneling current probe (TCP) for non-contact, non-invasive diode evaluation. The tunneling current probe is inherently a much simpler, faster, and more versatile system compared to electron beam testers. In the tunneling current probe, the electrons are not accelerated and therefore have energies at least three orders of magnitude lower than an electron beam. Moreover, the scanning tunneling microscope does not require a vacuum nor an electron beam gun and focusing equipment. It can uniquely determine the three key characteristics of a photodiode, namely the I-V curve, spectral responsivity, and dynamic resistance. Advantages of the tunneling current probe over other competing techniques (for example e-beam probing) include elimination of material damage, low heat deposition, the capability for working in air, and the simplicity of the probe itself which translate into lower production costs. By using a vacuum chamber and cold shield, the system is equally, capable of testing photodiodes such as HgCdTe at their cryogenic operating temperature.

In accordance with the invention, a wafer inspection system based on the tunneling current probe is provided. The new procedure affords non-contact, non-invasive, in-situ device evaluation at the wave level. Although the tunneling current probe evolved primarily as a surface research tool, it can be adapted to measure current via electron tunneling from a probe tip to the contact pads of the devices under test. In conjunction with an optical beam, the responsivity and dynamic resistance of individual photodiodes can be measured as a function of wavelength. Or by applying electrical signals to an integrated circuit the current and voltage levels can be probed in a contactless manner at various points of interest. A related invention is the scanning tunneling microscope which uses the tunneling current probe to scan a surface in order to produce topographic information with resolution at the atomic scale.

The contactless nature of the probe, and its capability for the measurement of small voltage or current variations makes it appropriate for wafer-level testing of the individual photodiodes of a focal plane array. Here, a method that avoids hard contact with the conductive pads deposited on the wafer is required to prevent mechanical damage or surface contamination, both effects having deleterious consequences in the performance of the affected photodiodes. The probe can work either in vacuum or in air, which provides considerable flexibility for the choice of the most convenient environment to perform the in-process testing of the wafer.

SUMMARY OF THE INVENTION

Accordingly, it is a primary object of the present invention to provide a method and apparatus for monitoring the performance parameters of a photodiode prior to its integration into a focal plane array. The photodiode under test is arranged on a support table. A laser device illuminates the photodiode with infrared radiation to generate a current within the photodiode. A contactless tunnel current probe is arranged adjacent the photodiode for measuring the current therein via electron tunneling techniques. The measured current is processed to determine the dynamic resistance and responsivity of the photodiode under test without contacting or invading the photodiode.

According to a more specific object of the invention, the dynamic resistance of the photodiode is determined as a function of the ratio of the change in photodiode voltage produced by a change in photodiode current to photodiode current change.

It is another object of the invention to provide a servo system connected with the support table for positioning the photodiode adjacent the tunnel current probe at a height within a given optical wavelength. The servo includes a laser interferometer and piezoelectric translator for repositioning the support table and photodiode relative to the probe.

According to another object of the invention, a data processor and control device controls sequential positioning of the photodiodes under test and determines and stores the parameters of each device. An automated transport system is also under control of the control device to transport photodiodes to and from the testing location beneath the tunnel current probe.

BRIEF DESCRIPTION OF THE FIGURES

Other objects and advantages of the present invention will become apparent from a study of the following specification when viewed in the light of the accompanying drawing, in which:

FIG. 5 is a block diagram of an automated photodiode wafer or integrated circuit inspection system according to the invention.

DETAILED DESCRIPTION

Figure 1:
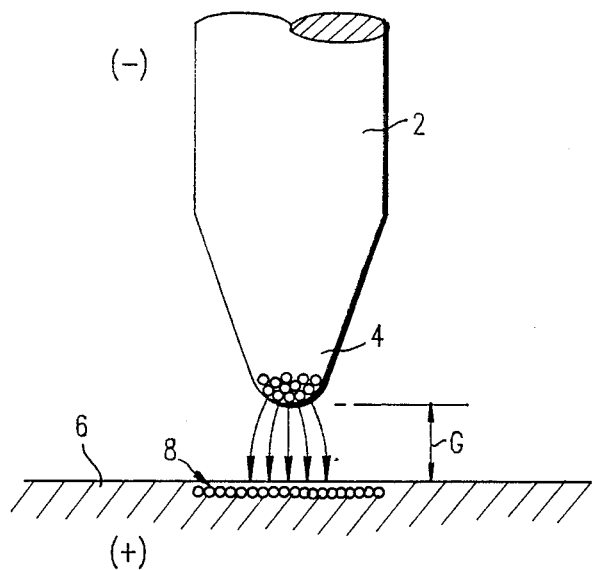
FIG. 1 is a partial schematic diagram illustrating the basic principle of the tunneling current probe of the prior art.

The operation of the contactless current probe according to the invention will be described with reference to FIG. 2. As will be developed below, the probe can operate in either the constant impedance or constant current mode.

In the constant impedance mode of operation the current probe 10 comprises a tungsten tip 12, a piezoelectric translator 14, and a holding device 16. A tunnel current $I_P$ of the tip 12 and the contact pad 18 of the device 20 under test, which in this case is a photodiode, is set by a current control device 22. The average value of the current is kept constant by a servo loop which comprises the piezoelectric translator 14 and a driver 24.

A radiation source 26 is arranged adjacent to the device under test for directing a beam 28 of infrared radiation onto the photodiode. The radiation source is adjusted to produce a photo-current equal to $I_P$. In addition, a voltage modulation $V_{PM}$ is introduced by a signal generator 32 which induces a current modulation $I_{PM}$. The current modulation $I_{PM}$ is sensed by a comparator 34 which delivers a signal to a locking amplifier 36 which corresponds to the modulation current $I_{PM}$. In order to obtain complete current-voltage characteristics, the measurement is repeated for different settings of bias voltage $V_P$ generated by the power supply 38.

In accordance with the constant current mode of operation, the voltage modulation normally introduced by the signal generator 32 (which preferably comprises an oscillator) is replaced by modulation of the radiation beam 28. The current $I_{PM}$ is now generated by this modulated background radiation. A servo-system is designed to compensate for this current change by adjusting the degree of separation between the tip 12 and the contact pad 18. The correction voltage generated by the driver 24 and applied to the piezoelective translator 14 to reposition the tip relative to the pad is a measurement of the voltage charge of the pad. The measurement is repeated for different dc background radiation levels in order to obtain complete characterization of the device.

The modulation current and voltage measurements are processed to determine the dynamic resistance and responsivity of the diode under test.

Figure 3:
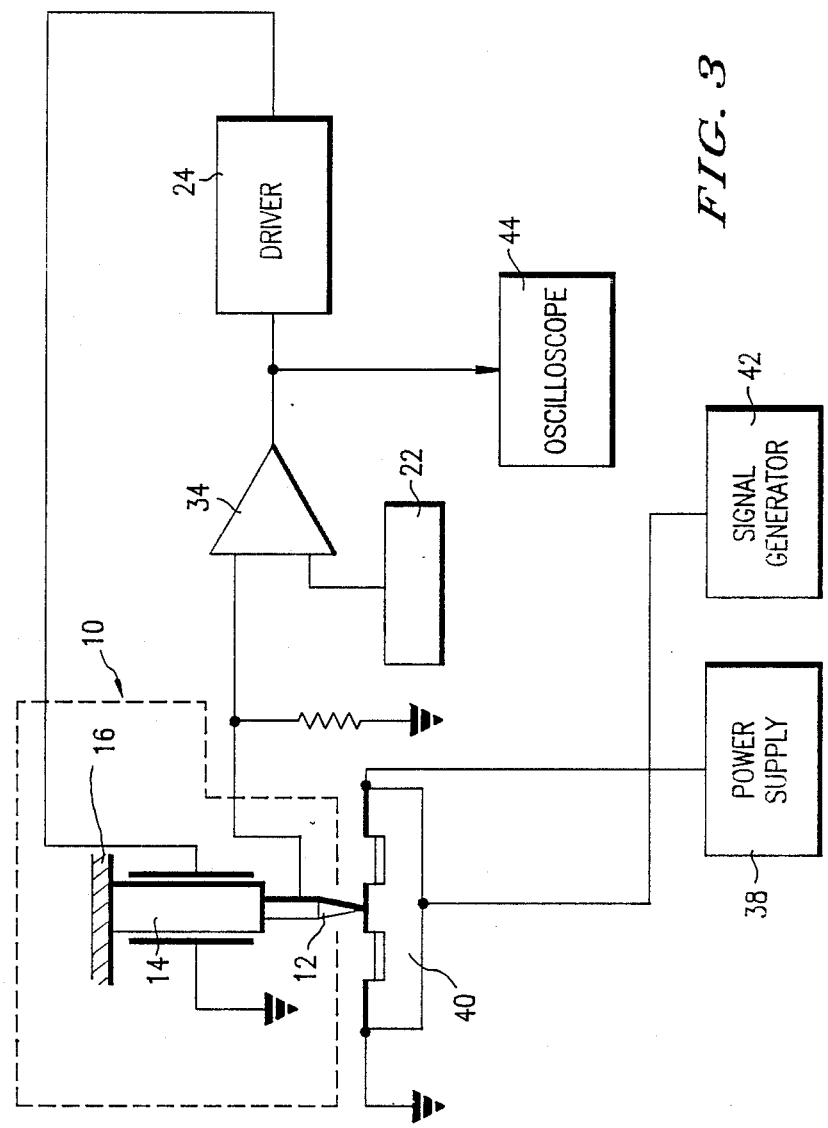
FIG. 3 is a block diagram illustrating the use of the tunneling current probe as a diagnostic tool for testing integrated circuits in the active mode at various critical parts of the device in a contactless and non-invasive manner.

In FIG. 3 there is shown an embodiment for measuring the characteristics of an integrated circuit 40 using a contactless current probe 10 according to the invention. The integrated circuit is in the active mode and powered by the power supply 38. In addition, signals may be injected into the integrated circuit by a signal generator 42. Voltage signals at various parts of the integrated circuit device are picked up by the contactless probe 10 and displayed on an oscilloscope 44. The voltage signals are used to determine the parameters of the circuit under test.

Figure 4:
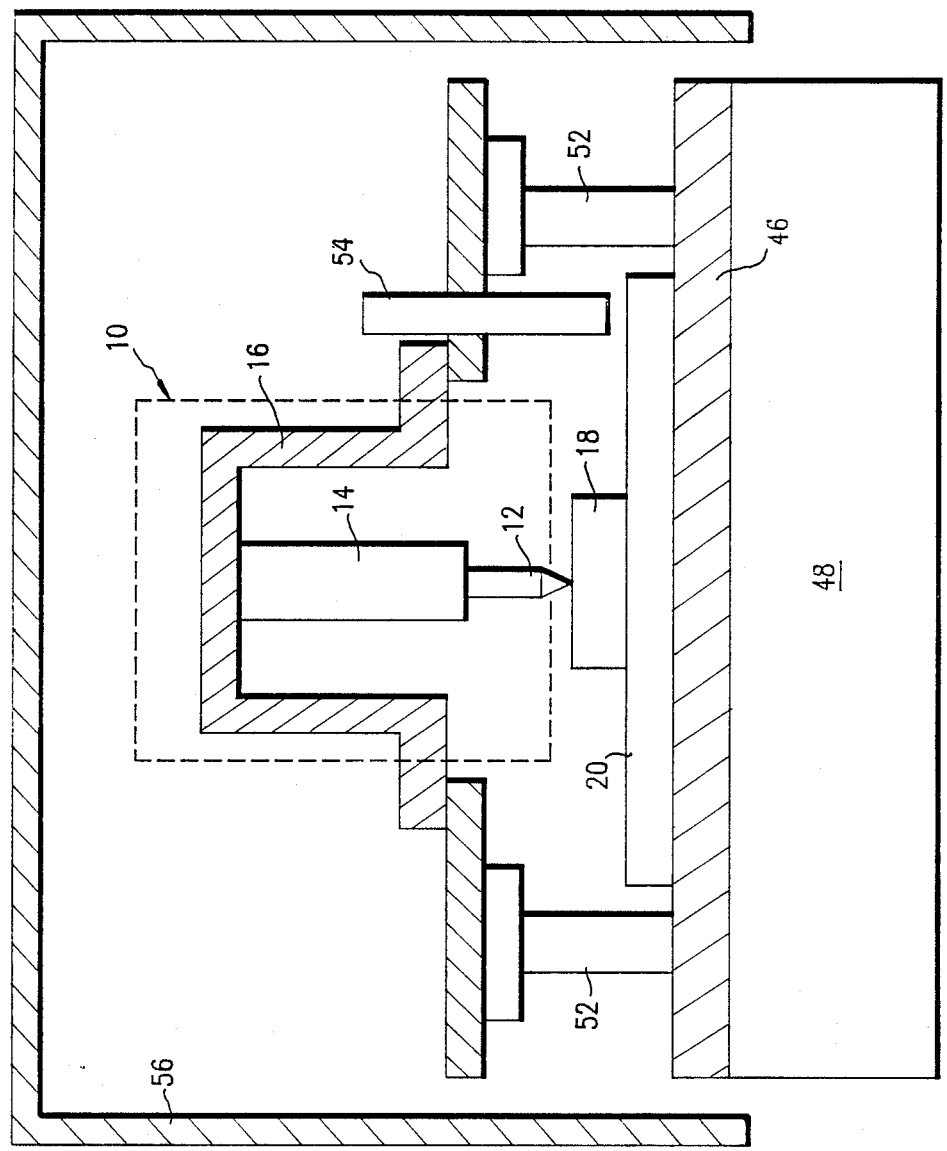
FIG. 4 is a schematic drawing showing details of an automated inspection system according to the invention.

Referring now to FIGS. 4 and 5, an automated wafer inspection system featuring a contactless current probe based on electron tunneling will be described. The photodiode array 20 under test is mounted on a wafer carrier 46 which is connected with a cryostat system 48 for cooling the device if desired. Since photodiodes fabricated from mercury cadmium telluride must be cooled to the temperature of liquid nitrogen for optimum performance, it is desirable to perform testing at this temperature as well. The cryostat system provides a cryogenically cooled platform for supporting the photodiode.

The probe tip 12 is moved from one measurement point on the array to another by an x-y stage 50. Coarse probe height adjustment is performed by a stepping motor assembly mechanism 52 controlled by an optical height sensor 54. Fine height adjustment is accomplished with the piezoelectric translator 14.

A cold shield 56 surrounds the assembly to reduce the thermal background radiation. To avoid condensation and to reduce correction losses of the cryogenically cooled parts, a vacuum system including a bell jar 58 and vacuum source 60 are provided. In order to eliminate mechanical shocks during testing, the cyostat support system is mounted on a vibration isolation stage 62.

Figure 2:
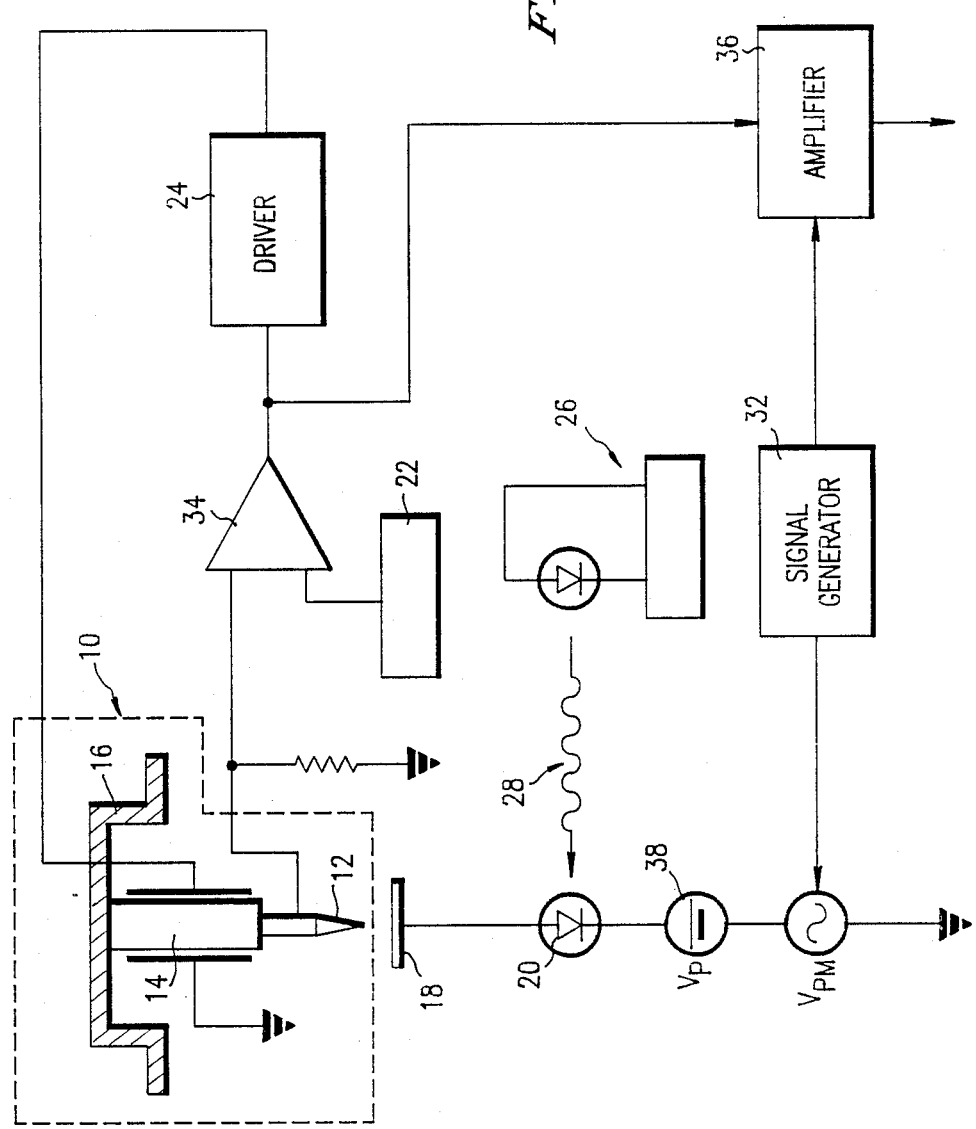
FIG. 2 is a block diagram illustrating the major system components for contactless testing of a photodiode according to the constant impedance or current method.

As in the embodiments of FIGS. 2 and 3, a laser illumination device is provided for generating infrared radiation which is directed onto the photodiode array under test to induce a current and/or a voltage which is measured and processed.

As shown in FIG. 5, the automated testing system 10 comprises a plurality of control modules for controlling either operation of various testing subsystems or testing parameters. These control modules include a cold shield temperature control device 64, a bias current stabilization and measuring device 66, the radiation bias source 68, an optical height sensor control 70, an x-y stage control 72, a coarse vertical positioning control 74, a bias voltage source and modulation generator 76, a wafer temperature control device 78, and a vacuum control and monitoring device 35.

Each of the control modules is in turn controlled by a computer and data logging device 82 to effect transport and positioning of the array under test, execution of the measurement operation, and storage of relevant data such as the position of each photodiode on the wafer and the electrical characteristics of each diode.

The dynamic resistance of the photodiode under test can be determined using the tunnel current probe by measuring the diode voltage change $dV_D$) produced by a small diode current variation (dI) and calculating the ratio ($dV_D/dI$) therebetween. In practice, it may become convenient to keep the diode current constant and change the illumination condition. In a contactless method there is no direct access to the measurement of the diode voltage $V_D$. Its value can be determined indirectly from the measurement of the diode current and the photon flux (or any other relevant parameter) by using previously measured current-voltage characteristics for several values of the photon flux. These characteristics have to be measured using a direct contact probe and under exactly the same conditions of geometry, temperature and background radiation. A calibration of this type is required in any contactless measuring method.

The final position depends on the tunnel current ($I_T$), which is set by the operator via a current control device, and a servo loop is used to keep this current constant by adjusting the spacing between the tip and the pad. Allowed currents for atomically thin tips go as high as a few nanoamps. By keeping the tunnel current constant, variations of the pad voltage are translated into distance adjustments. A previous determination of the tip $dV_{PZT}/dV_T$ vs. $I_T$ characteristics for several $V_T$ values would allow the conversion of $dV_{PZT}$ to $dV_D$, where $dV_{PZT}$ is the change in voltage of the piezoelectric translator 14.

The dynamic control of the tip position provides the corrections needed to compensate the temperature drifts, which are fairly slow. The control loop bandwidth can be much higher than required for the temperature drift correction. Therefore, by modulating the photon flux at a high enough frequency, but still within the control loop bandwidth, it is possible to separate the position adjustment needed to compensate for the change of the bonding pad voltage from the thermal drift contribution. Mechanical vibrations of the whole assembly have to be kept to a minimum. The effect of remaining vibrations can be separated out by carefully choosing the modulation frequency and by the use of lock-in phase-sensitive detection.

In order to ensure uniform responsivity of the whole array, it is important to be capable of determining the cut-off wavelength of each element of the array. This parameter is directly related to the energy band gap and indirectly related to the material composition. The cut-off wavelength can be determined by measuring dynamic resistance as described above with a modulated radiation source having different output wavelength. In other words, the characteristics of a diode may be evaluated at the center of a spectral operating regime and at the band edges. Of course, for a more complete characterization, the radiation source could also be scanned over the complete spectral band.

In accordance with the method and apparatus of the present invention, the principle of tunneling electrons is used to measure the electrical characteristics of photodiodes and integrated circuits without contacting or invading the device under test.

While in accordance with the provisions of the patent statute the preferred from and embodiments of the invention have been illustrated and described, it will be apparent to those of ordinary skill in the art that various changes may be made without deviating from the inventive concepts set forth above.

What is claimed is:

1. A method for monitoring performance parameters of a photodiode prior to integration into a focal plane array utilizing electron tunneling techniques, comprising the steps of
    (a) illuminating the photodiode with infrared radiation to generate a current within the photodiode;
    (b) providing an electron tunnel probe near the photodiode;
    (c) adjusting the distance between the tip of the probe and the surface of the photodiode to within 100 Angstroms;
    (d) measuring the current through the photodiode via electron tunneling techniques using the tunnel current probe; and
    (e) processing the measured current to determine the dynamic resistance and responsivity of the photodiode under test, whereby contact and invasion of the photodiode under test is avoided.

2. A method as defined in claim 1, wherein dynamic resistance is determined as a function of the ratio of the change in one of photodiode voltage and current produced by a change in one of photodiode voltage and radiation flux.

3. A method as defined in claim 2, and further comprising the step of positioning the tip of the tunnel current probe to within a given optical wavelength from the surface of the photodiode under test.

4. A method as defined in claim 3, wherein the distance between the photodiode and electron tunnel probe is adjusted in accordance with laser heterodyne interferometry techniques.

5. A method as defined in claim 4, wherein the position of the photodiode relative to the tunnel current probe is adjusted in accordance with the tunnel current of the tunnel current probe.

6. A method for testing an integrated circuit utilizing electron tunneling techniques, comprising the steps of
    (a) energizing the circuit to its active mode;
    (b) illuminating the circuit with infrared radiation to generate a current therein;

(c) providing a contactless tunnel current probe near the integrated circuit;
(d) adjusting the distance between the tip of the probe and the surface of the integrated circuit to within 100 Angstroms;
(e) measuring the current throughout the integrated circuit at a plurality of locations via election tunneling techniques using said contactless tunnel current probe; and
(f) processing the measured current to determine the dynamic resistance and responsivity of the circuit under test, whereby contact and invasion of the circuit under test is avoided.

7. Apparatus for monitoring performance parameters of a photodiode prior to integration into a focal plane array utilizing electron tunneling techniques, comprising
(a) a support table for supporting a photodiode under test;
(b) means for illuminating the photodiode with infrared radiation to generate a current within the photodiode;
(c) the tip of a contactless tunnel current probe located within 100 Angstroms of the surface of the photodiode for measuring the current within the photodiode via electron tunneling techniques; and
(d) means for processing the current measured by said tunnel current probe to determine the dynamic resistance and responsitivity of the photodiode under test, whereby contact and invasion of the photodiode under test is avoided.

8. Apparatus as defined in claim 7, and further comprising means for adjusting the distance between said support table and the tip of said probe so that the surface of the photodiode under test relative to the probe is positioned a given optical wavelength.

9. Apparatus as defined in claim 8, wherein said distance adjusting means comprises a laser interferometer for measuring displacement of the photodiode and a servo system which repositions said support table in response to the output of said laser interferometer.

10. Apparatus as defined in claim 9, wherein said distance adjusting means further comprises a piezoelectric translator for controlling said servo system to reposition said support table in accordance with the tunnel current of said probe.

11. Apparatus as defined in claim 10, wherein said illuminating means comprises a laser device and an optical fiber directing said infrared radiation onto the photodiode.

12. Apparatus as defined in claim 11, wherein said support table comprises a cryostat system for cooling the photodiode for optimum performance.

13. Apparatus as defined in claim 12, and further comprising a housing defining a vacuum chamber within which said support table, said laser illuminating means, said current probe, and said laser interferometer are arranged.

14. Apparatus as defined in claim 13, and further comprising data processing and control means connected with said laser illuminating means, said current probe, said laser interferometer, and said servo system for controlling the operation thereof, said data processing means determining dynamic resistance as a function of the ratio of the change in photodiode voltage produced by a change in photodiode current to the photodiode current change.

15. A method for testing an integrated circuit, comprising the steps of
(a) energizing the circuit to its active mode
(b) providing an electron tunnel probe near the integrated circuit;
(c) adjusting the distance between the tip of the probe and the surface of the integrated circuit to within 100 Angstroms; and
(d) measuring the current throughout the integrated circuit at a plurality of locations via election tunneling techniques using a contactless tunnel current probe.

* * * * *